(12) United States Patent
Nalla et al.

(10) Patent No.: US 10,602,039 B2
(45) Date of Patent: Mar. 24, 2020

(54) ULTRA-COMPACT IMAGE SENSOR ASSEMBLY FOR THIN PROFILE DEVICES

(71) Applicant: Microsoft Technology Licensing, LLC, Redmond, WA (US)

(72) Inventors: Ravi Kiran Nalla, San Jose, CA (US); Raymond Kirk Price, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 130 days.

(21) Appl. No.: 15/269,416

(22) Filed: Sep. 19, 2016

(65) Prior Publication Data
US 2018/0084647 A1   Mar. 22, 2018

(51) Int. Cl.
*H04N 5/225* (2006.01)
*H05K 3/46* (2006.01)
(Continued)

(52) U.S. Cl.
CPC ......... *H04N 5/2254* (2013.01); *H04N 5/2253* (2013.01); *H04N 5/2257* (2013.01);
(Continued)

(58) Field of Classification Search
CPC .. H04N 5/2253; H04N 5/2254; H04N 5/2257; H05K 1/113; H05K 1/183;
(Continued)

(56) References Cited

U.S. PATENT DOCUMENTS

| 6,890,107 B1 | 5/2005 | Brophy et al. |
| 7,214,996 B2 | 5/2007 | Perillat |

(Continued)

FOREIGN PATENT DOCUMENTS

| CN | 102346509 | 2/2012 |
| CN | 102858098 | 1/2013 |

(Continued)

OTHER PUBLICATIONS

"2-Layer Busbars Copper Bus Bars & PCB Circuit Board Stiffeners", Available at: http://e-fab.com/products/pcb-stiffeners/, Mar. 3, 2016, 6 pages.

(Continued)

*Primary Examiner* — Ngoc Yen T Vu
(74) *Attorney, Agent, or Firm* — Rainier Patents, P.S.

(57) ABSTRACT

This document describes techniques and apparatuses that implement an ultra-compact image sensor assembly. In some embodiments, a printed circuit board assembly comprises a multilayer printed circuit board (PCB) having an asymmetric core structure. A cavity extends from an exterior layer of the multilayer PCB to an exposed portion of an interior layer of the multilayer PCB. The interior layer can be formed on the asymmetric core structure or another PCB layer above the asymmetric core structure. An image sensor is mounted at least partially in the cavity and electrically connected to conductive pads embodied on the exposed portion of the interior layer of the multilayer PCB. By mounting the image sensor in the cavity, height and planar dimensions of the image sensor assembly can be reduced, thereby enabling thinner profile imaging devices.

23 Claims, 9 Drawing Sheets

(51) Int. Cl.
*H05K 1/02* (2006.01)
*H05K 1/18* (2006.01)

(52) U.S. Cl.
CPC ......... *H05K 1/0206* (2013.01); *H05K 3/4697* (2013.01); *H05K 1/183* (2013.01); *H05K 2201/10121* (2013.01); *H05K 2201/10151* (2013.01)

(58) Field of Classification Search
CPC ....... H05K 1/0206; H05K 2201/10151; H05K 2201/10121; H05K 3/4697; H05K 3/4691; H05K 3/46
USPC .................................. 348/374; 257/433–434
See application file for complete search history.

(56) References Cited

U.S. PATENT DOCUMENTS

| | | | | |
|---|---|---|---|---|
| 7,269,017 | B2 * | 9/2007 | Berlin | H01L 23/3677 361/719 |
| 7,405,102 | B2 * | 7/2008 | Lee | H01L 23/3677 257/E21.705 |
| 7,782,391 | B2 | 8/2010 | Lin | |
| 8,432,485 | B1 | 4/2013 | Martinez et al. | |
| 8,514,317 | B2 | 8/2013 | Lin | |
| 8,681,500 | B2 * | 3/2014 | Wyland | H01L 23/3128 257/713 |
| 9,167,683 | B2 * | 10/2015 | Moul | H01P 3/088 |
| 2006/0163714 | A1 * | 7/2006 | Tsao | H01L 23/3121 257/687 |
| 2007/0272846 | A1 | 11/2007 | Wu | |
| 2008/0055403 | A1 | 3/2008 | Salman et al. | |
| 2008/0079829 | A1 | 4/2008 | Choi et al. | |
| 2009/0180257 | A1 * | 7/2009 | Park | H01L 23/64 361/709 |
| 2011/0194023 | A1 | 8/2011 | Tam et al. | |
| 2014/0159185 | A1 | 6/2014 | Hwang | |
| 2014/0264691 | A1 | 9/2014 | Oganesian et al. | |
| 2014/0264692 | A1 | 9/2014 | Oganesian et al. | |
| 2014/0312450 | A1 | 10/2014 | Tagle et al. | |
| 2015/0048461 | A1 | 2/2015 | Meyer | |
| 2015/0243937 | A1 | 8/2015 | Dinh et al. | |
| 2015/0318323 | A1 | 11/2015 | Borthakur et al. | |
| 2016/0035785 | A1 | 2/2016 | Oganesian | |
| 2017/0345714 | A1 * | 11/2017 | Scharf | H01L 24/06 |
| 2018/0020138 | A1 * | 1/2018 | Wang | H04N 5/2254 |

FOREIGN PATENT DOCUMENTS

| | | |
|---|---|---|
| CN | 103037150 | 4/2013 |
| GB | 2411307 | 8/2005 |
| WO | WO 10066065 | 6/2010 |

OTHER PUBLICATIONS

"LG Unveils 5.3-Inch Smartphone Display with World's Narrowest Beze", Available at: http://gadgets.ndtv.com/mobiles/news/lg-unveils-53-inch-smartphone-display-with-worlds-narrowest-bezel-614040, Oct. 30, 2014, 2 pages.

"Omnivision launches the ov9734, the Company's Smallest 720p HD Sensor for Next-Gen Notebooks and Mobile Devices", Retrieved at: http://www.prnewswire.com/news-releases/omnivision-launches-the-ov9734-the-companys-smallest-720p-hd-sensor-for-next-gen-notebooks-and-mobile-devices-300093247.html, Jun. 3, 2016, 2 pages.

Langer,"Advanced Thermal Management Solutions on PCBs for High Power Applications", In Journal of IPC Apex Expo, Mar. 25, 2014, 15 pages.

Maxwell,"New Images Leak of Slim-Bezel Sony Xperia C5 Ultra, Xperia M5 with Fast F 2.2 Aperture", Available at: http://9to5google.com/2015/07/31/sony-xperia-c5-ultra-xperia-m5-leak/, Jul. 31, 2015, 5 pages.

Weiss,"Low-cost electro-optical package for use with PCB-embedded waveguides", In Proceedings of SPIE Active and Passive Optical Components for Communications VII, vol. 6775, Sep. 10, 2007, 2 pages.

* cited by examiner

ULTRA-COMPACT IMAGE SENSOR ASSEMBLY FOR THIN PROFILE DEVICES

BACKGROUND

Electronic device manufacturers often design mobile devices to provide users with a seamless and immersive interactive experience. To do so, these devices are typically designed to be as small and thin as possible, inconspicuous to the user. For example, many smart-phones have shed dedicated audio ports, expandable memory slots, and physical keyboards in order to reduce respective device or bezel thickness. This trend of increasingly thin devices, however, is limited by larger device components that either provide critical device functionalities or have been slower to scale down in size relative to other component and assembly technologies.

In some cases, one of these larger components drives a thickness or shape of an entire device or electronic accessory. By way of example, consider a camera module of a smart-phone, which typically protrudes from a rear casing of the smart-phone. To achieve suitable optical performance, the camera module remains one of the larger and more-prominent sensors of a smart-phone and requires a certain height due to performance needed from the lens within the camera sensor. This often limits placement of the camera module to a rear housing, front bezel, or other user-facing location. These locations and underlying sub-assemblies, however, are unable to accommodate the height of most camera sensors, which results in a thickness of the device being increased to account for excessive sensor height.

SUMMARY

This document describes techniques and apparatuses that implement ultra-compact sensor assemblies for thin profile devices. In some embodiments, a printed circuit board assembly comprises a multilayer printed circuit board (PCB) having an asymmetric core structure. A cavity extends from an exterior layer of the multilayer PCB to an exposed portion of an interior layer of the multilayer PCB. The interior layer can be formed on the asymmetric core structure or another PCB layer above the asymmetric core structure. An image sensor is mounted at least partially in the cavity and electrically connected to conductive pads embodied on the exposed portion of the interior layer of the multilayer PCB. By mounting the image sensor in the cavity, height and planar dimensions of the image sensor assembly can be reduced, thereby enabling thinner profile imaging devices.

In some cases, the printed circuit board assembly also includes a lens support structure mounted to the exterior layer of the multilayer PCB and a lens mounted in the lens support structure and over the cavity. In such cases, the lens may extend through the lens support structure and into the cavity, such that a portion of the lens resides below the exterior layer of the multilayer PCB. Alternately or additionally, the asymmetric core structure may include thermal vias or a high conductivity thermal region that extends from the interior layer to another exterior layer of the multilayer PCB. Coupled to the image sensor, these thermal vias or thermal region can sink heat through the asymmetric core structure and away from the image sensor thereby improving sensor thermal performance.

This summary is provided to introduce simplified concepts that are further described below in the Detailed Description. This summary is not intended to identify essential features of the claimed subject matter, nor is it intended for use in determining the scope of the claimed subject matter. Techniques and/or apparatuses that implement ultra-compact sensor assemblies are also referred to herein separately or in conjunction as the "techniques" as permitted by the context, though techniques may include or instead represent other aspects described herein.

BRIEF DESCRIPTION OF THE DRAWINGS

Embodiments of ultra-compact image sensor assemblies for thin profile devices are described with reference to the following drawings. The same numbers are used throughout the drawings to reference like features and components.

DETAILED DESCRIPTION

Overview

Figure 1:
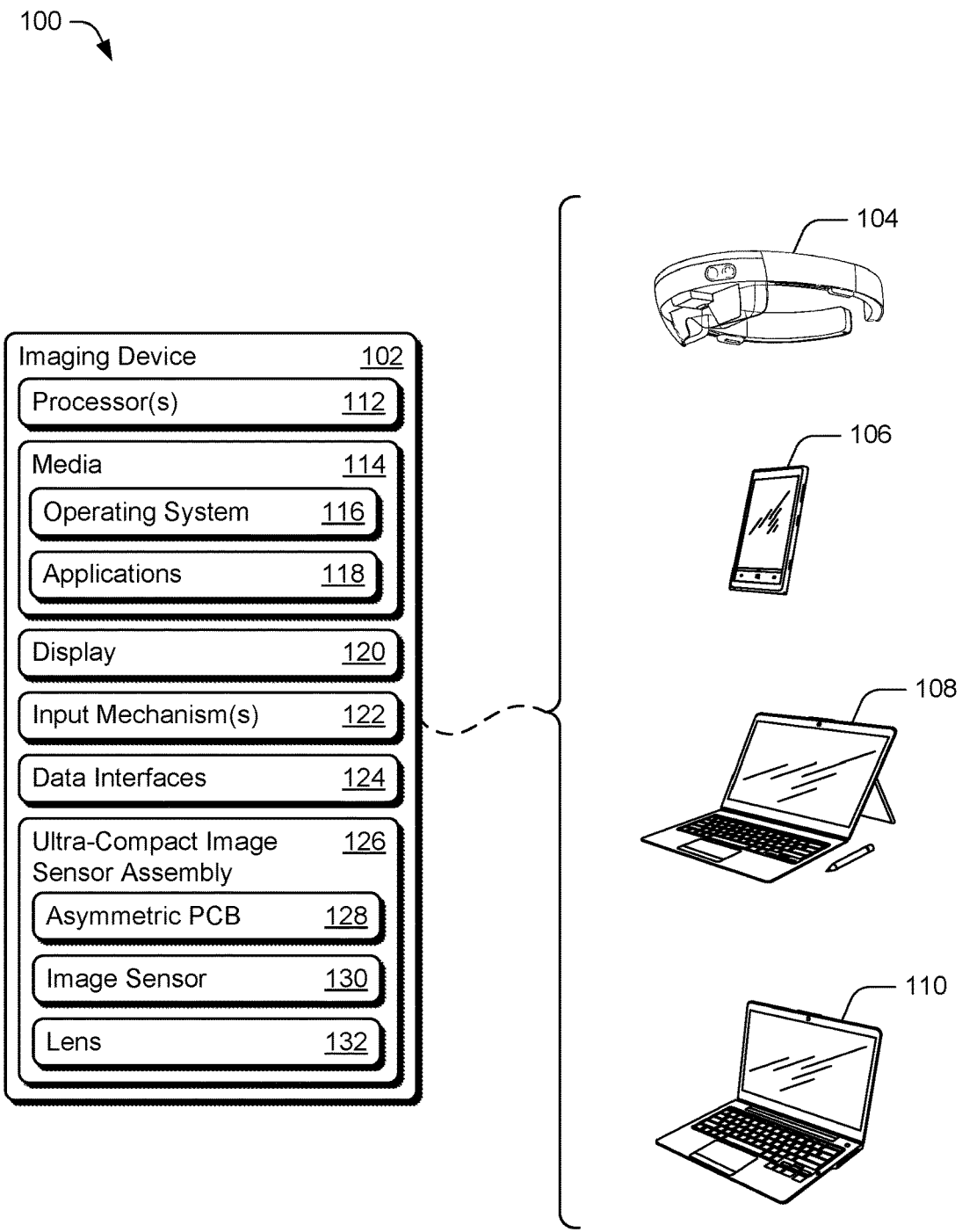
FIG. 1 illustrates an example environment that includes devices in which an ultra-compact image sensor assembly can be implemented.

This document describes techniques and apparatuses that implement ultra-compact sensor assemblies for thin profile devices. These techniques and apparatuses may implement a printed circuit board assembly that comprises a multilayer printed circuit board (PCB) having an asymmetric core structure. A cavity extends from an exterior layer of the multilayer PCB to an exposed portion of an interior layer of the multilayer PCB. The interior layer can be formed on the asymmetric core structure or another PCB layer above the asymmetric core structure. An image sensor is mounted at least partially in the cavity and electrically connected to conductive pads embodied on the exposed portion of the interior layer of the multilayer PCB. By mounting the image sensor in the cavity, height and planar dimensions of the image sensor assembly can be reduced, thereby enabling thinner profile imaging devices.

The asymmetric core structure, or an asymmetric PCB, can be fabricated by forming a rigid core layer of the PCB and laminating additional PCB layers "up" on one side of the core layer. In some cases, the additional PCB layers have a through-layer hole or aperture that, when laminated together, form a cavity in the asymmetric PCB. In other cases, a cavity is routed down through the additional PCB layers to the core layer or another internal layer. By placing the rigid core layer toward the bottom of the asymmetric PCB's stack-up, the cavities formed or routed into the PCB have minimal effect on rigidity or strength of the asymmetric PCB. This enables the manufacture of thin PCBs that are not only extremely rigid, but include cavities suitable for nesting various components, such as image sensors.

Nesting an image sensor in a cavity of the asymmetric PCB enables other optical components, such as a lens holder and lens, to move closer to a surface of the PCB, thereby reducing a height of the image sensor assembly. In some cases, electrical connections for the image sensor are made through electrical contacts provided at the bottom of the cavity instead of wire bonds across an exterior surface of the PCB. In such cases, planar dimensions (e.g., X and Y) of the optical components can also be reduced, further reducing the size envelope of the image sensor assembly. This ultra-compact image sensor assembly, having a reduced height and planar dimensions, enables the implementation of thinner profile image-capable devices. Additionally, for some devices, such as head-mounted displays (HMDs), a reduced assembly height enables greater system design flexibility. This can be an important aspect for designing and manufacturing HMDs, which include a large number of parts and assemblies that are integrated into a very compact space.

Further, the rigidity of the asymmetric core may improve image sensor performance, by providing a more-stable platform on which to mount the sensor. For example, the rigidity of the core layer can minimize tilt, angle, and warping variations that are typically associated with thin PCBs. By so doing, a modulation transfer function (MTF) of the image sensor, which measures contrast and sharpness, can be improved and/or made more consistent between image sensor assemblies and across the field of view for a given image sensor assembly. These are but a few examples of many ways in which the techniques or apparatuses are implemented, others of which are described below.

Example Operating Environment

FIG. 1 illustrates an example operating environment 100 in which ultra-compact sensor assemblies can be embodied. The operating environment 100 includes an imaging device 102, which is illustrated with four examples: smart glasses 104, a smart-phone 106, a tablet computer 108, and a laptop computer 110, though other devices and systems, such as digital cameras, range finders, optical media drives, fiber optic equipment, optical scanners, computing devices, webcams, and televisions may also be used.

The imaging device 102 includes processor(s) 112 and computer-readable storage media 114 (media 114). The media 114 includes an operating system 116 and applications 118, which enable various functions of the imaging device 102. The operating system 116 manages resources of the imaging device 102, such as the processor 112, media 114, and other hardware subsystems. The applications 118 comprise programs or code that access the resources managed by operating system 116 to implement various functions of the imaging device 102.

The imaging device 102 may also include a display 120, input mechanisms 122, and data interfaces 124. Although shown integrated with some imaging devices, such as the smart glasses 104, the display 120 can be implemented separate from the imaging device 102. The input mechanisms 122 may include gesture-sensitive sensors and devices, such as touch-based sensors and movement-tracking sensors (e.g., camera-based), buttons, touch pads, accelerometers, and microphones with accompanying voice recognition software, to name a few.

The data interfaces 124 include any suitable wired or wireless data interfaces that enable the imaging device 102 to communicate data with other devices or networks. Wired data interfaces may include serial or parallel communication interfaces, such as a universal serial bus (USB) and local-area-network (LAN). Wireless data interfaces may include transceivers or modules configured to communicate via infrastructure or peer-to-peer networks. One or more of these wireless data interfaces may be configured to communicate via near-field communication (NFC), a personal-area-network (PAN), a wireless local-area-network (WLAN), or wireless wide-area-network (WWAN).

The imaging device 102 also includes an ultra-compact image sensor assembly 126, which enables imaging functionalities of the device. In this particular implementation, the ultra-compact image sensor assembly 126 includes an asymmetric printed circuit board 128 (asymmetric PCB 128), image sensor 130, and lens 132. Although not shown, the ultra-compact image sensor assembly 126 may also include other optical or mechanical components, such as lens holders, illuminators, illumination assemblies, mirrors, polarizers, films, gaskets, seals, and the like.

The asymmetric PCB 128 is a multilayer PCB having an asymmetric or non-symmetric materials stack-up. For example, the asymmetric PCB 128 may include a rigid core layer at the bottom of the stack-up and multiple pre-impregnation (pre-preg) layers laminated to the core layer effective to build a thickness of the PCB "up" from the core layer. Alternately or additionally, the asymmetric PCB 128 may also include a cavity in which various types of components can be mounted to reduce a height of an assembly that includes the asymmetric PCB.

The image sensor 130 can sense or capture light, such as ambient light levels, various imagery, or color information. In some cases, the image sensor 130 is implemented as a backside-illuminated sensor with a silicon layer and circuitry behind a photocathode layer. In other cases, the image sensor 130 is implemented as a frontside-illuminated sensor. The sensor may comprise a complimentary metal-oxide-semiconductor (CMOS) sensor array or a charged-coupled device (CCD) sensor array. Alternately or additionally, the image sensor can be implemented with other optical components, such as light-emitting diodes (LEDs), to implement scanning, distance ranging, or other functionalities.

The lens 132 focuses the light on the image sensor 130 and may be formed from any suitable type of transparent material, such as glass, plastic, or other composites. In some cases, the lens 132 is formed with a lens holder or lens support structure configured to position a light-emitting surface of the lens adjacent to a light-receiving surface of the image sensor 130. In other cases, the lens holder or lens support structure is implemented separately from the lens 132 and configured to receive the lens 132. In such cases, the lens 132 can be mounted to the lens holder with an adhesive or bonding agent to securely position the lens 132 relative the image sensor 130.

Figure 2:
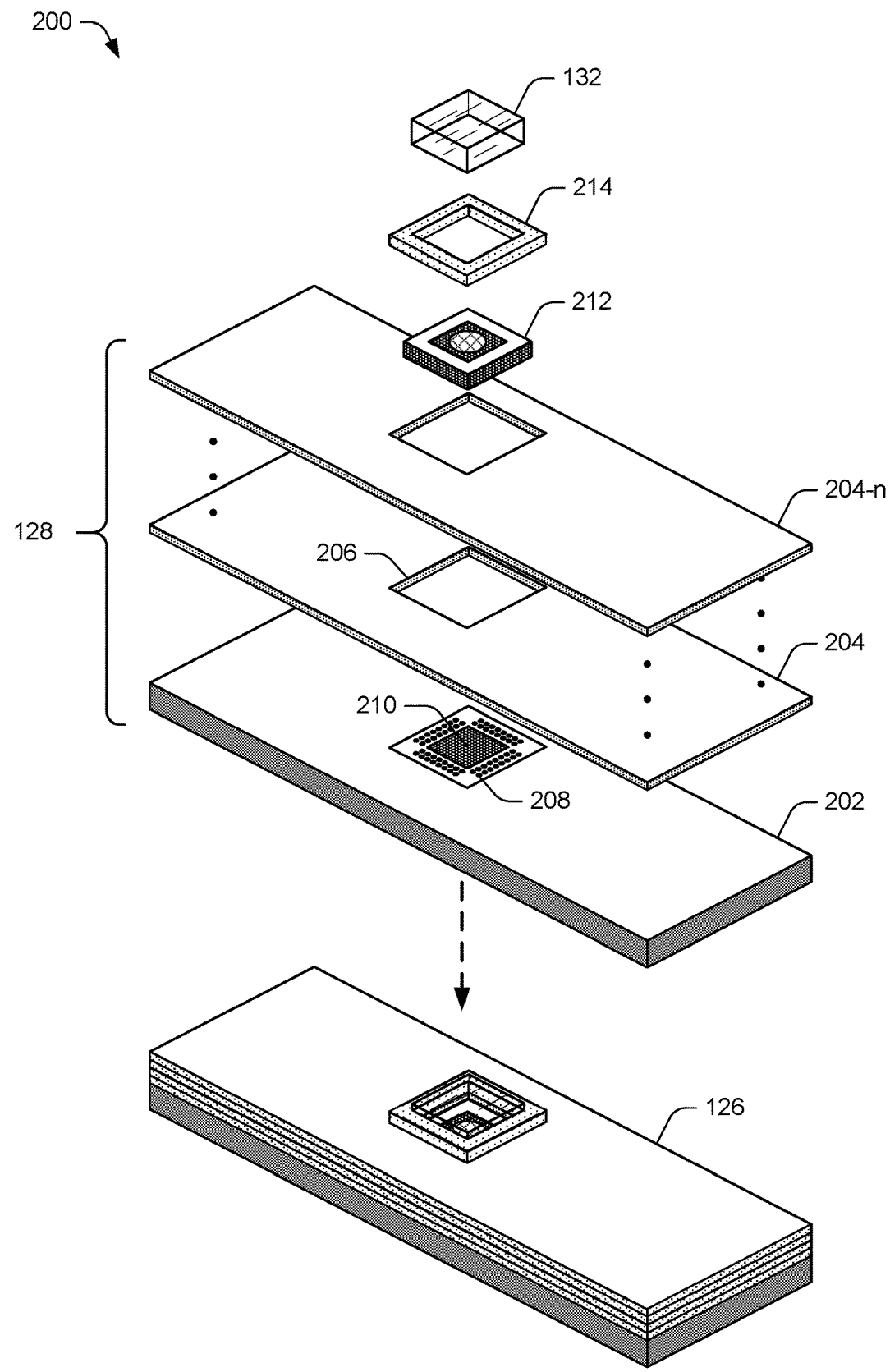
FIG. 2 illustrates example components of an ultra-compact image sensor assembly in accordance with one or more aspects.

FIG. 2 illustrates example components of an ultra-compact image sensor assembly 126 generally at 200. In this particular example, the components are shown as an exploded assembly and a complete assembly to further illustrate various aspects described herein. The asymmetric PCB 128 includes a core layer 202 and layer 204 through layer 204-$n$, where n is any suitable integer. Although not shown, the asymmetric PCB may include additional PCB layers on the bottom of the core layer 202, where the number of additional PCB layers is fewer than n. Further, although shown as one layer, the core layer 202 may include multiple layers of fiberglass laminated together.

The core layer 202 may be formed from any suitable material, such as fiber glass, a glass fiber epoxy laminate (e.g., FR4), glass reinforced epoxy (e.g., G10), and the like. The layers 204 through 204-*n* can include pre-impregnated (pre-preg) fiberglass layers that are impregnated with resin or adhesive to facilitate lamination to the core layer 202. Alternately or additionally, the core layer 202 or one of layers 204 through 204-*n* may be implemented as a flex circuit layer.

In some embodiments, the layers 204 through 204-*n* include a through-layer hole 206 that, when laminated to the core layer 202, forms a cavity suitable for nesting or countersinking components. Although shown as having a similar size or shape, respective through-layer holes may vary or step to provide a shelf for lens holder or other structure. For example, a through-layer hole of an exterior layer may be larger than that of an adjacent layer and plated with a metallic coating to facilitate nesting of an electromagnetic interference shield over a nested component.

The core layer also includes electrical contacts 208 and a thermal structure 210. The electrical contacts 208 include electrical pads connected to vias or traces of the core layer 202 or other PCB layers. The thermal structure may include thermal vias or a high thermal conductivity region that extends through the core layer 202 to an exterior layer or surface of the asymmetric PCB 128. In some cases, the thermal structure 210 is thermally coupled to a heat sink or chassis of an imaging device. Although described primarily with reference to an image sensor, the cavity, electrical contacts, and/or thermal structure of the PCB may be configured to nest other types of components, such as an LED, laser diode, processor, memory module, power management IC, power transistor, fingerprint scanner, and so on.

In this particular example, a backside-illuminated sensor 212 is soldered to the electrical contacts 208 of the core layer 202 via a micro ball grid array (micro-BGA) and thermally coupled to the thermal structure 210 (e.g., thermal paste/adhesive). By so doing, electrical connections can be established with the backside-illuminated sensor 212 without the use of wire bonds, which enables lens holder 214 to be mounted coplanar with the exterior layer of the asymmetric PCB 128. A lens 132 of the ultra-compact image sensor assembly 126 resides in the lens holder 214 and may also extend into the cavity, thereby decreasing a height or thickness of the ultra-compact image sensor assembly 126.

Figure 3:
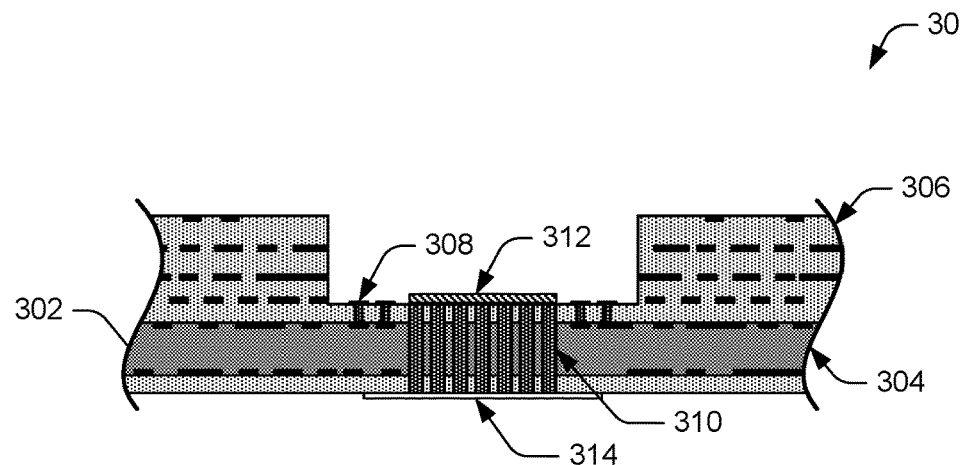
FIG. 3 illustrates an example configuration of an ultra-compact image sensor assembly that includes a backside-illuminated sensor.
Figure 3:
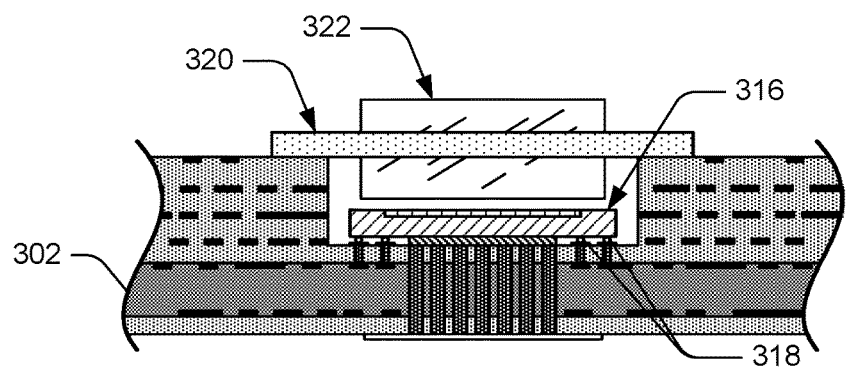
Figure 3:
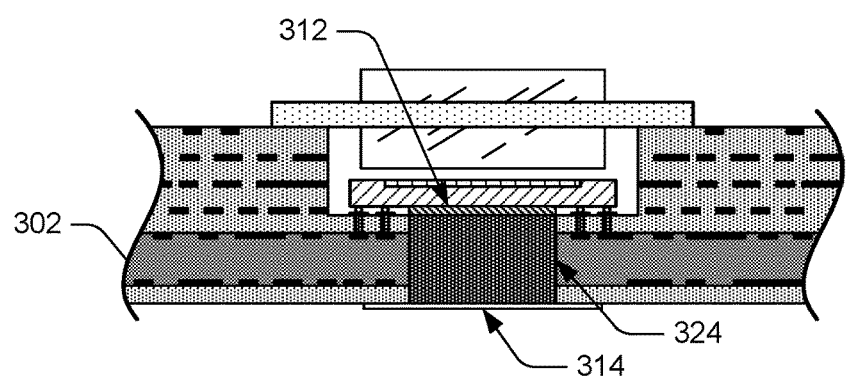

FIG. 3 illustrates an example configuration of an ultra-compact image sensor assembly that includes a backside-illuminated sensor generally at 300. An asymmetric PCB 302 includes a core layer 304 and laminated layers 306 (e.g., pre-preg layers) in which a cavity is formed. The asymmetric PCB 302 may be formed to any suitable thickness, such as approximately one-half millimeter to one millimeter. A thickness of the core layer 304 may vary from approximately 100 microns to 400 microns. Further, a depth of the cavity (or recess) into the asymmetric PCB 302 may range from approximately 100 microns to 1000 microns. In some cases, a thickness of the PCB layers or pre-preg layers laminated to the core layer ranges from approximately 50 microns to 150 microns.

The asymmetric PCB 302 includes electrical contacts 308 disposed in the cavity and thermal vias 310 that extend from the cavity to a backside of the asymmetric PCB 302. The electrical contacts 308 can be formed on the core layer 304 or another internal layer of the asymmetric PCB 302. The vias may be fabricated at any suitable size and pitch, such as with a diameter that ranges from 50 microns to 250 microns and a pitch that ranges from 100 microns to 400 microns. In some cases, the thermal vias 310 are filled with a thermally conductive material, such as copper or a metal particle filled epoxy.

The asymmetric PCB 302 also includes a thermal compound 312 and an insulative layer 314. In some cases, the thermal compound 312 provides thermal coupling to a physical housing of a component that is soldered to the electrical contacts 308. The insulative layer 314 can be configured prevent the thermal vias from shorting to a heat sink or chassis structure proximate the backside of the asymmetric PCB 302.

In this particular example, the ultra-compact image sensor assembly includes a backside-illuminated image sensor 316 (e.g., CMOS sensor) soldered to electrical contacts via solder balls 318. This image sensor can be relatively thin (e.g., 100-200 microns), such that the backside-illuminated image sensor 316 occupies less than half the depth of the cavity. Further, by utilizing the solder balls 318 instead of wire bonds, a lens holder 320 can be mounted planer to the exterior layer of the asymmetric PCB 302. A lens 322 is mounted to the lens holder 320 and may extend through the lens holder into the cavity. In addition to reducing a thickness of the image sensor assembly, the lack of wire bonds may enable planar dimensions (e.g., X and Y) of the assembly to be reduced by approximately 500 microns to 750 microns per side. Thus, an image sensor assembly implemented in accordance with embodiments described herein may be one millimeter to two millimeters smaller per side than a traditional sensor assembly.

In some embodiments, an ultra-compact image sensor assembly includes a high thermal conductivity region 324 instead of, or in addition to, the thermal vias 310. As shown in FIG. 3, the high thermal conductivity region 324 may extend through the core layer 304, contacting the thermal compound 312 and the insulative layer 314, to facilitate the transfer of heat away from the backside-illuminated image sensor 316. In some cases, this is effective to improve thermal performance of the image sensor, which in turn can enable either cooler operation of the device, or it can enable the use of more complex computations on supporting electronics on the image sensor. Alternately or additionally, improved thermal performance can enable operating the image sensor with an increased frame rate.

Figure 4:
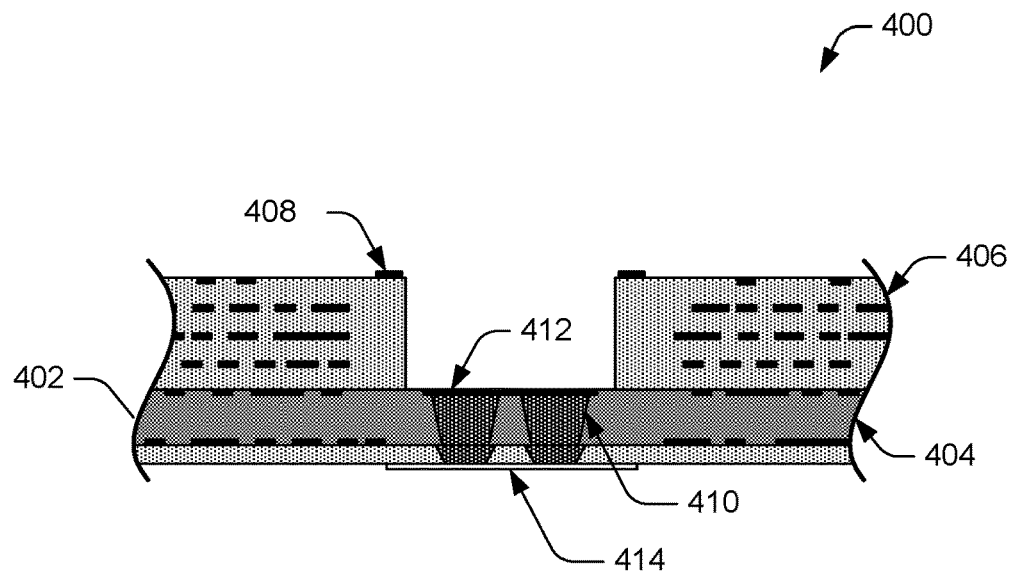
FIG. 4 illustrates an example configuration of an ultra-compact image sensor assembly that includes a frontside-illuminated sensor.
Figure 4:
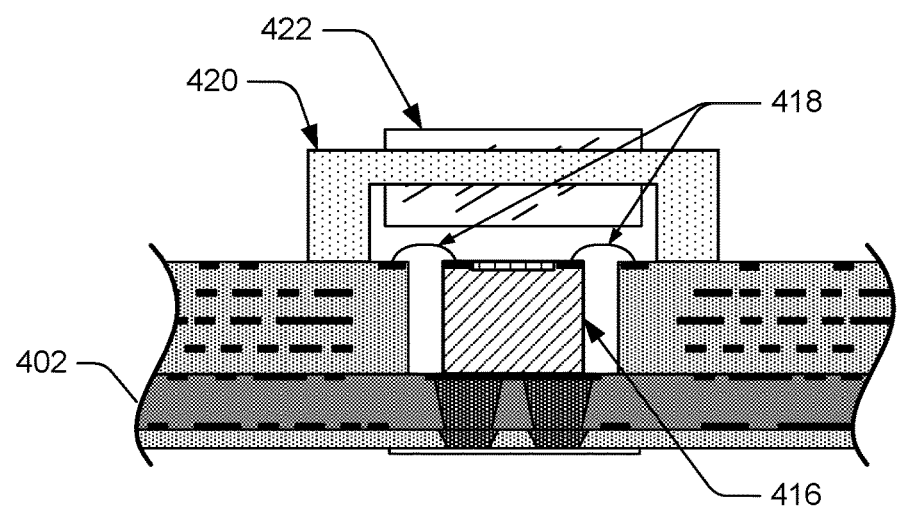

FIG. 4 illustrates an example configuration of an ultra-compact image sensor assembly that includes a frontside-illuminated sensor generally at 400. An asymmetric PCB 402 includes a core layer 404 and laminated layers 406 in which a cavity is formed to receive a component. The asymmetric PCB 402 may be formed to any suitable thickness, such as approximately one millimeter to two millimeters thick. A thickness of the core layer 404 may range from approximately 300 microns to 700 microns. In some cases, a depth of the cavity (or recess) into the asymmetric PCB 402 ranges from approximately 300 microns to 1500 microns.

This asymmetric PCB 402 includes electrical contacts 408 disposed on an exterior layer of the PCB and thermal vias 410 that extend from the cavity to a backside of the asymmetric PCB 402. The electrical contacts 408 can be formed on the exterior layer of the PCB at locations that are optimal for wire bond connections. The vias may be fabricated at any suitable size and pitch, such as with a diameter that ranges from 50 microns to 250 microns and a pitch that ranges from 100 microns to 400 microns. The thermal vias 410 may be filled with a thermally conductive material, such as copper or a metallic epoxy, to decrease a thermal resistance between the cavity and the backside of the PCB.

The asymmetric PCB 402 also includes a thermal pad 412 and an insulative layer 414. In some cases, the thermal pad 412 is formed from heavy copper foil to facilitate the transfer of heat into the thermal vias. The insulative layer 414 is configured to prevent the thermal vias from shorting to a heat sink or chassis structure proximate the backside of the asymmetric PCB 402. The insulative layer 414 may comprise any suitable type of insulative material, such as polyimide, silk screen, or solder mask.

In this particular example, the ultra-compact image sensor assembly includes a frontside-illuminated image sensor 416 that is mounted to thermal pad 412 and connected to electrical contacts 408 by wire bonds 418. As shown in FIG. 4, nesting the frontside-illuminated image sensor 416 in the cavity enables a lens holder 420 and lens 422 to be positioned proximate the exterior layer of the PCB. In some cases, this can be effective to reduce a height of the assembly by the height of the image sensor (e.g., 400-600 microns). Alternately or additionally, the use of the top-side wire bonds may be effective to reduce planar dimensions of the image sensor assembly by approximately 250 microns to 500 microns per side.

Figure 5:
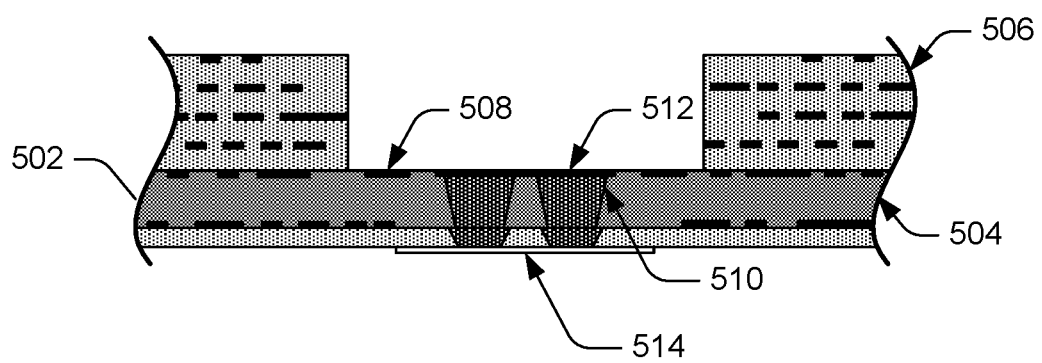
FIG. 5 illustrates another example configuration of an ultra-compact image sensor assembly that includes a frontside-illuminated sensor.
Figure 5:
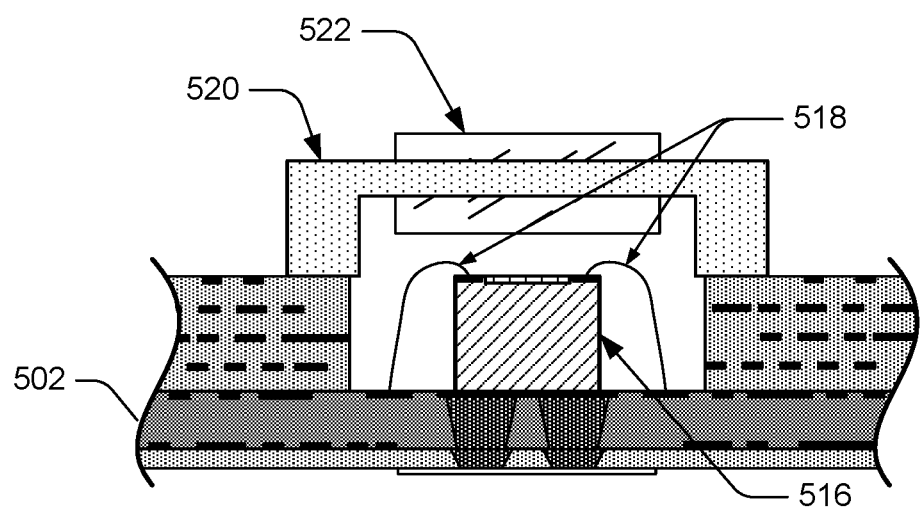

FIG. 5 illustrates another example configuration of an ultra-compact image sensor assembly that includes a frontside-illuminated sensor generally at 500. In this particular example, an asymmetric PCB 502 includes a core layer 504 and laminated layers 506 in which a cavity is formed. The asymmetric PCB 502 may be formed to any suitable thickness, such as approximately one millimeter to two millimeters. A thickness of the core layer may range from approximately 400 microns to 900 microns. In some cases, a depth of the cavity (or recess) into the asymmetric PCB 502 ranges from approximately 300 microns to 1600 microns.

This asymmetric PCB 502 includes electrical contacts 508 disposed on the core layer 504 and thermal vias 510 that extend from the cavity to a backside of the asymmetric PCB 502. The electrical contacts 508 can be formed on the core layer 504 at locations that are optimal for wire bond connections in the cavity. In some cases, the thermal vias 510 are filled with a thermally conductive material, such as copper or a metal particle filled epoxy (e.g., copper or nickel particles), to improve heat transfer from the cavity to the backside of the asymmetric PCB 502.

The asymmetric PCB 502 also includes a thermal pad 512 and an insulative layer 514. In some cases, the thermal pad 512 is formed from heavy copper foil or plating to improve heat transfer into the thermal vias. The insulative layer 514 can prevent the thermal vias from shorting to a heat sink or other metallic structures proximate the backside of the asymmetric PCB 502. The insulative layer 514 may comprise any suitable type of insulative material, such as polyimide, silk screen, or solder mask.

In this example configuration, the ultra-compact image sensor assembly includes a frontside-illuminated image sensor 516 that is glued to the thermal pad 512 and connected to the electrical contacts 508 by wire bonds 518. As shown in FIG. 5, nesting the frontside-illuminated image sensor 516 in the cavity enables a lens holder 520 and lens 522 to be positioned proximate the exterior layer of the PCB. In some cases, this can be effective to reduce a height of the assembly by approximately a height of the image sensor (e.g., 500-700 microns).

Example Methods

The methods described herein may be used separately or in combination with each other, in whole or in part. These methods are shown as sets of operations (or acts) performed, such as through one or more entities or modules, and are not necessarily limited to the order shown for performing the operation. For example, the techniques may implement an asymmetric PCB for an ultra-compact image sensor assembly by forming a PCB core layer and laminating PCB layers that include a through-layer hole to one side of the PCB core layer. Alternately, the techniques laminate multiple PCB layers to one side of a PCB core layer and then mechanically route a cavity through the multiple laminated PCB layers to the core layer or other internal layer of the PCB. In some embodiments, the techniques may laminate multiple PCB layers to one side of a PCB core layer and then use a laser to route a cavity through the multiple laminated PCB layers to the core layer or other internal layer of the PCB. These are but a few examples of implementing ultra-compact image sensor assemblies using the techniques described herein. In portions of the following discussion, reference may be made to the operating environment 100 of FIG. 1, the components or assemblies of FIGS. 2-5, and other methods and example embodiments described elsewhere herein, reference to which is made for example only.

Figure 6:
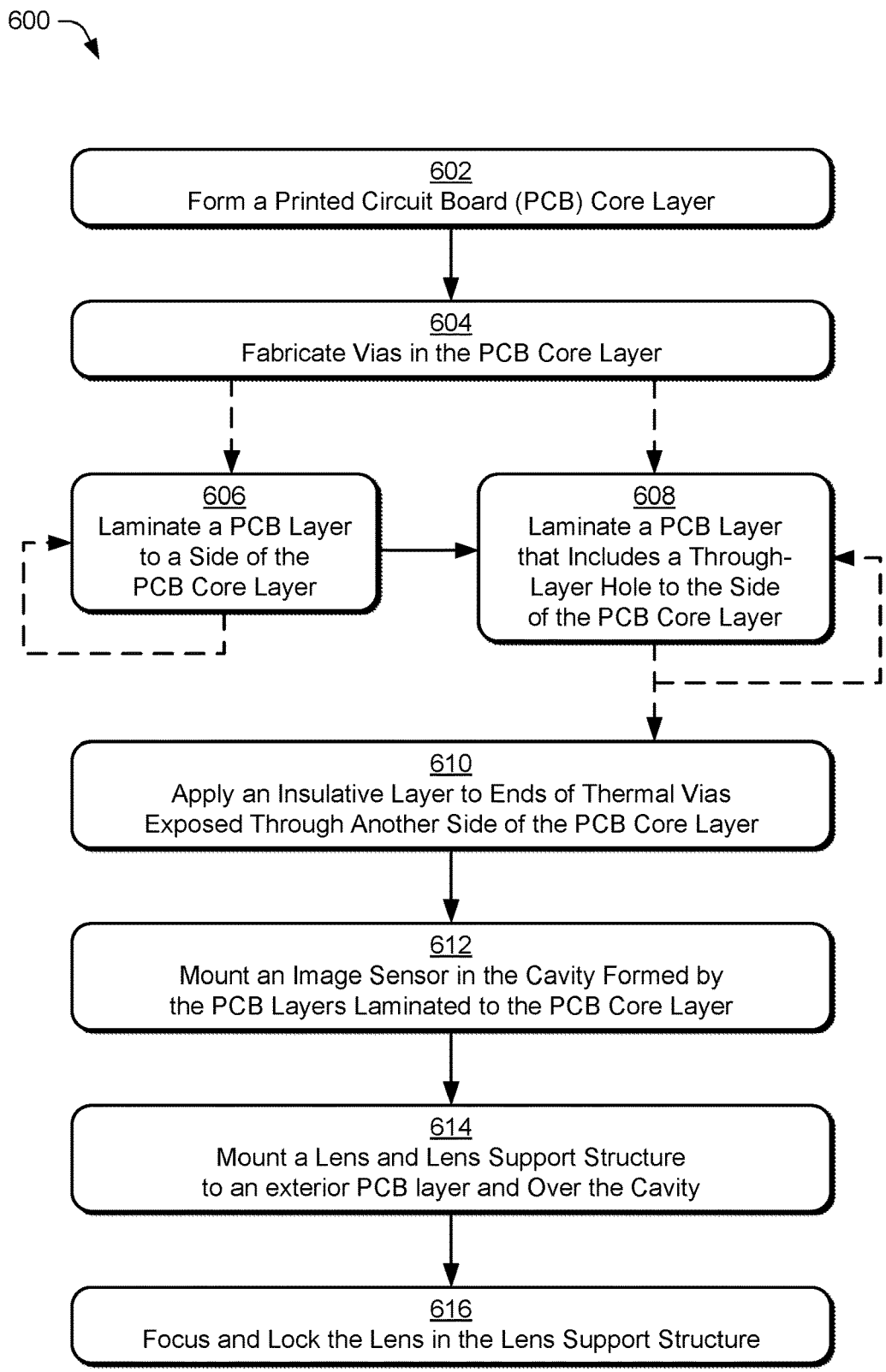
FIG. 6 illustrates an example method for manufacturing an ultra-compact image sensor assembly with PCB layers that include through-layer holes.

FIG. 6 depicts a method 600 for manufacturing an ultra-compact image sensor assembly with PCB layers that include through-layer holes. The ultra-compact image sensor assembly may be implemented similar to or differently from the ultra-compact image sensor assembly 126 as described with reference to FIGS. 1-5.

At 602, a printed circuit board (PCB) core layer is formed. The PCB core layer can be formed from any suitable material, such as a glass fiber epoxy laminate (e.g., FR4). In some cases, copper is clad onto epoxy-impregnated fiberglass material and then etched to form circuitry of exterior layers of the PCB core layer.

At 604, vias are fabricated in the PCB core layer. The vias may be drilled as through hole that extend through the PCB core layer or partial vias that extend from an exterior layer to into the PCB core layer. Once drilled, the vias may be plated with conductive material to form electrical or thermal interconnects. In some cases, larger thermal vias are drilled through the PCB core layer. The drilling operation may also comprise drilling or routing a cavity into the PCB core layer that is configured to receive a high thermal conductivity region.

From operation 604, the method 600 proceeds to operation 606 to laminate a PCB layer to one side of the PCB core layer or operation 608 to laminate a PCB layer that includes a through-layer hole to one side of the PCB core layer. PCB layers may also be laminated to another side of the PCB core layer, such as to add a signal or ground plane below the PCB core layer.

At 606, a PCB layer is laminated to one side of the PCB core layer to build up an asymmetric PCB. This PCB layer may include a pre-preg layer that having circuit traces and vias that provide electrical connectivity between layers of the asymmetric PCB. In some cases, operation 606 is repeated to build up non-cavity PCB layers between the PCB core layer and other PCB layers that form the cavity. From operation 606, the method 600 proceeds to operation 608 to form a cavity in the asymmetric PCB.

At 608, a PCB layer that includes a through-layer hole is laminated to one side of the PCB core layer. This PCB layer may include a pre-preg layer that having circuit traces and vias that provide electrical connectivity between layers of the asymmetric PCB and components mounted to an exterior layer. In some embodiments, the through-hole layer is configured such that laminating multiple PCB layers that include the through-hole layer form a cavity in the asymmetric PCB. To do so, the method 600 can repeat operation 608 to laminate additional PCB layers to the PCB core layer effective build up the PCB and contribute more depth to the cavity.

At 610, an insulative layer is applied to ends of thermal vias that are exposed through another side of the PCB core layer. In some cases, the insulative layer is applied to respective covers or bottom metallization of the thermal vias. The insulative layer may also be applied to areas of the asymmetric PCB's exterior layer proximate the thermal vias. The insulative layer may comprise any suitable material, such as solder resist, solder mask, silk screen, polyimide, lacquer, polymer, and the like. This insulative layer can be effective to electrically isolate the thermal vias, and circuitry connected thereto, from a heat sink or other conductive structures mounted on or proximate the exterior layer of the asymmetric PCB.

At 612, an image sensor is mounted in the cavity formed by the PCB layers that are laminated to the PCB core layer. In some cases, the image sensor is mounted by soldering electrical contacts of the image sensor to electrical pads disposed at the bottom of the cavity. In other cases, the image sensor is glued or soldered to a thermal pad located at the bottom of the cavity. In such cases, electrical connections to the image sensor can be formed via wire bonds to corresponding electrical pads in the cavity or an exterior layer of the asymmetric PCB. Alternately or additionally, a physical housing of the image sensor can be thermally coupled to the thermal vias at the bottom of the cavity.

At 614, a lens and lens support structure are mounted to an exterior PCB layer. The lens and lens support structure are mounted such that the lens is positioned above the cavity. The lens and lens support structure may be mounted as a preassembled component or individually as separate parts. The lens can be mounted using any suitable material, such as an adhesive, gasket material, epoxy, and the like. In some cases, the lens extends through the lens support structure and into the cavity in which the image sensor resides. In such cases, this can be effective to further reduce a height of the ultra-compact image sensor assembly.

The lens support structure may be mounted planar to the exterior PCB layer. In other cases, the lens support structure is elevated from the exterior PCB layer to accommodate wire bonds of the image sensor. Alternately or additionally, the lens support structure may include self-locating features (e.g., pegs or edges) that fit into the cavity to ensure correct placement of the lens support structure, and thus a lens mounted therein.

At 616, the lens is focused and locked in the lens support structure. The lens is focused such that light entering the lens is focused on the image sensor mounted in the cavity. After focusing, the lens can then be locked in the lens support structure to prevent subsequent movement of the lens and/or to prevent the lens from becoming unfocussed.

Figure 7:
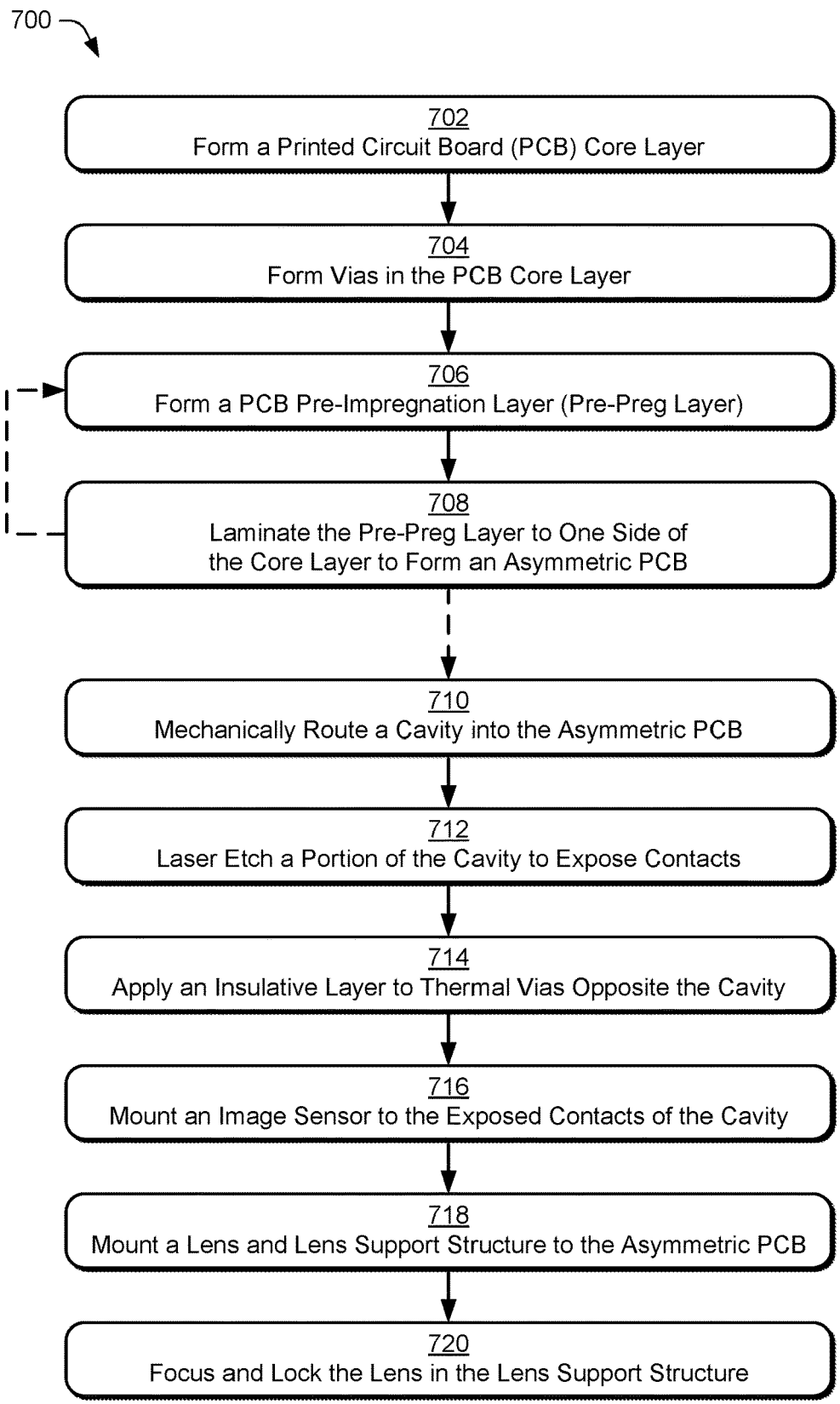
FIG. 7 illustrates an example method for manufacturing an ultra-compact image sensor assembly with PCB layers that are mechanically routed.

FIG. 7 depicts a method 700 for manufacturing an ultra-compact image sensor assembly with PCB layers that are mechanically routed. The ultra-compact image sensor assembly may be implemented similar to or differently from the ultra-compact image sensor assembly 126 as described with reference to FIGS. 1-5.

At 702, a printed circuit board is fabricated. The PCB core layer can be formed from any suitable material, such as a glass fiber epoxy laminate (e.g., FR4). In some cases, copper is clad onto epoxy-impregnated fiberglass material and then etched to form circuitry of exterior layers of the PCB core layer.

At 704, vias are fabricated in the PCB core layer. The vias may be drilled as through hole that extend through the PCB core layer or partial vias that extend from an exterior layer to into the PCB core layer. Once drilled, the vias may be plated with conductive material to form electrical or thermal interconnects. In some cases, larger thermal vias are drilled through the PCB core layer. The drilling operation may also comprise drilling or routing a cavity into the PCB core layer that is configured to receive a high thermal conductivity region.

At 706, a PCB pre-impregnation (pre-preg) layer is formed. The pre-preg layer may include a heat-sensitive resin or adhesive to facilitate lamination to the core layer or intervening pre-preg layers. The pre-preg layer may also include vias, such as blind vias or buried vias, that are configured to stack as the PCB layers are assembled. In some cases, the pre-preg layer also includes copper traces to provide electrical connectivity between adjacent layers of the PCB.

At 708, the PCB pre-preg layer is laminated to one side of the PCB core layer to build up an asymmetric PCB. In some cases, operations 706 and/or 708 are repeated to laminate additional pre-preg layers to the core layer until a desired thickness of the asymmetric PCB is achieved. From operation 708, the method 700 proceeds to operation 710 to form a cavity in the asymmetric PCB.

At 710, a cavity is mechanically routed into the asymmetric PCB. The cavity may be routed down to any internal layer of the asymmetric PCB or to the core layer. In some cases, the cavity is routed to an approximate depth of a target layer to prevent a router bit from tearing up traces or electrical pads embodied on the target layer.

At 712, a portion of the cavity is laser etched to expose contacts. The exposed contacts may include electrical pads or thermal pads configured to interface with an image sensor. The laser etching may ablate fiberglass or resin at the bottom of the cavity without damaging traces or electrical pads embodied on the internal layer or core layer of the PCB. Alternately or additionally, the exposed contacts can be cleaned and prepared for subsequent soldering operations.

At 714, an insulative layer is applied to ends of thermal vias that are exposed opposite the cavity. In some cases, the insulative layer is applied to respective covers or bottom metallization of the thermal vias. The insulative layer may also be applied to areas of the asymmetric PCB's exterior layer proximate the thermal vias. The insulative layer may comprise any suitable material, such as solder resist, solder mask, silk screen, polyimide, lacquer, polymer, and the like. This insulative layer can be effective to electrically isolate the thermal vias, and circuitry connected thereto, from a heat sink or other conductive structures mounted on or proximate the exterior layer of the asymmetric PCB.

At 716, an image sensor is mounted to the exposed contacts of the cavity. In some cases, the image sensor is mounted by soldering electrical contacts of the image sensor to exposed electrical pads at the bottom of the cavity. In other cases, the image sensor is glued or soldered to an exposed thermal pad at the bottom of the cavity. In such cases, electrical connections to the image sensor can be formed via wire bonds to corresponding electrical pads exposed in the cavity or an exterior layer of the asymmetric PCB. Alternately or additionally, a physical housing of the image sensor can be thermally coupled to exposed thermal vias at the bottom of the cavity.

At 718, a lens and lens support structure are mounted to an exterior PCB layer. The lens and lens support structure are mounted such that the lens is located above the cavity of the asymmetric PCB. The lens and lens support structure may be mounted as a preassembled component or individually as separate parts. The lens can be mounted using any suitable material, such as an adhesive, gasket material, epoxy, and the like. In some cases, the lens extends through the lens support structure and into the cavity in which the image sensor resides. In such cases, this can be effective to further reduce a height of the ultra-compact image sensor assembly.

The lens support structure may be mounted planar to the exterior PCB layer. In other cases, the lens support structure is elevated from the exterior PCB layer to accommodate wire bonds of the image sensor. Alternately or additionally, the lens support structure may include self-locating features that fit into the cavity (e.g., below the exterior layer) to ensure correct placement of the lens support structure, and thus a lens mounted therein.

At 720, the lens is focused and locked in the lens support structure. The lens is focused such that light entering the lens is focused on the image sensor mounted in the cavity. After focusing, the lens can then be locked in the lens support structure to prevent subsequent movement of the lens and/or to prevent the lens from becoming unfocussed.

Figure 8:
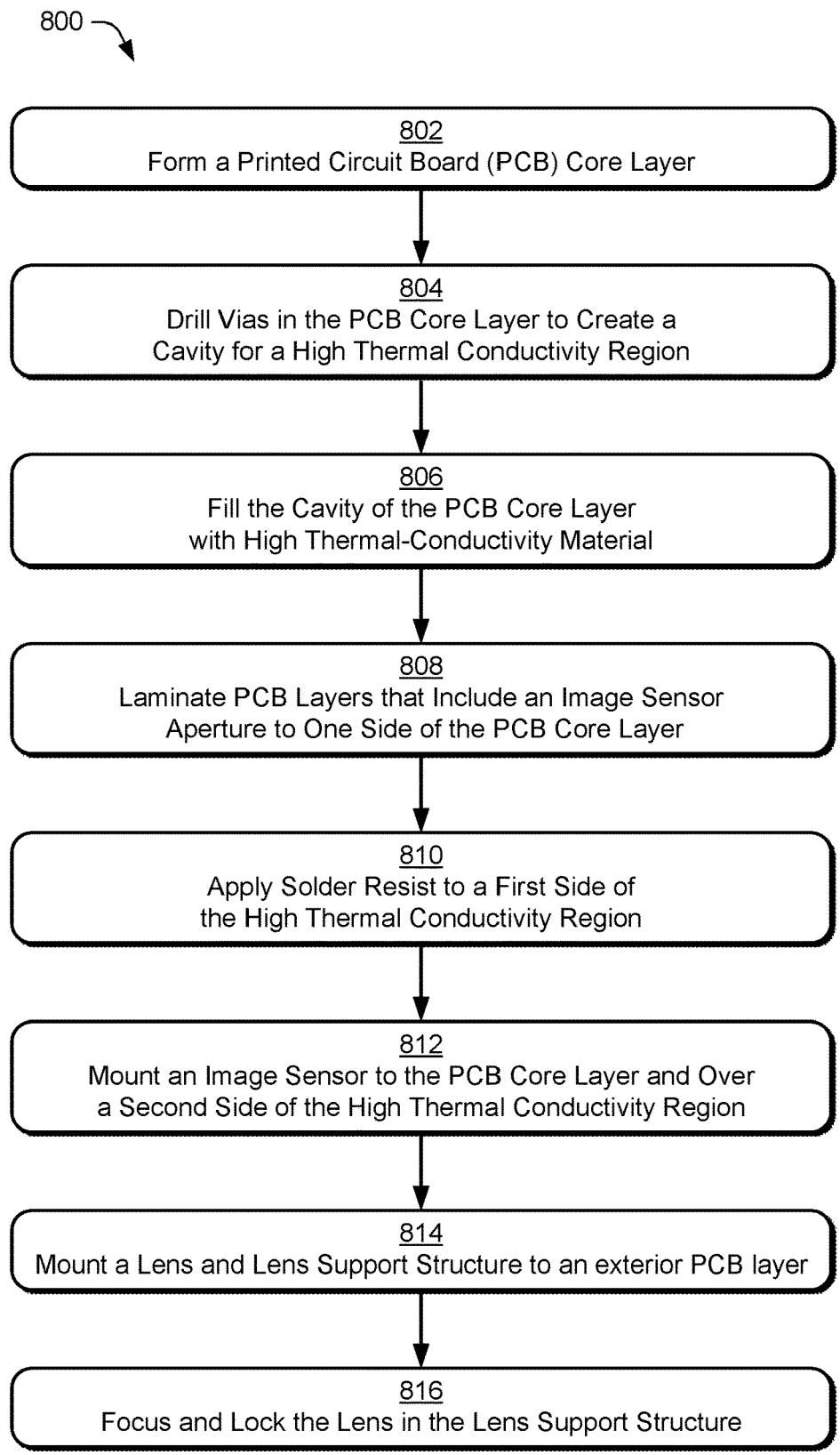
FIG. 8 illustrates an example method for manufacturing an ultra-compact image sensor assembly that includes a high thermal conductivity region.

FIG. 8 depicts a method 800 for manufacturing an ultra-compact image sensor assembly that includes a high thermal conductivity region. The ultra-compact image sensor assembly may be implemented similar to or differently from the ultra-compact image sensor assembly 126 as described with reference to FIGS. 1-5.

At 802, a printed circuit board (PCB) core layer is formed. The PCB core layer can be formed from any suitable material, such as a glass fiber epoxy laminate (e.g., FR4). In some cases, copper is rolled onto epoxy-impregnated fiberglass material and then etched to form circuitry on exterior layers of the PCB core layer.

At 804, vias are drilled in the PCB core layer to create a cavity for a high thermal conductivity region. The vias may be drilled as through hole vias that extend through the PCB core layer, partial vias that extend from an exterior layer to an interior layer of the PCB core layer, or blind vias between internal layers of the PCB core layer. Alternately or additionally, the PCB core layer may be mechanically routed to create the cavity to receive the high thermal conductivity region. The cavity may be rectangular with filleted or chamfered edges and extend through the PCB core layer from one exterior surface to another exterior surface on the opposite side of the PCB core layer.

At 806, the cavity of the PCB core layer is filled with high thermal conductivity material to form the high thermal conductivity region. The high thermal conductivity material may comprise any suitable type of material, such as copper, copper alloy, metal particle filled resin, metal particle filled epoxy, carbon foam, nanotube composite, and the like. In some cases, a surface of the high thermal conductivity region is polished or ground to provide a surface suitable for mounting an electronic components or heat sink. Alternately or additionally, a pre-formed high thermal conductivity region may be pressed or glued into the cavity of the PCB core layer.

At 808, PCB layers that include an image sensor aperture are laminated to one side of the PCB core layer. This PCB layer may include a pre-preg layer having circuit traces and vias to provide electrical connectivity between layers of the asymmetric PCB. In some embodiments, the PCB layer is configured such that laminating multiple PCB layers that include the image sensor aperture forms an image sensor aperture in the asymmetric PCB.

At 810, solder resist is applied to a first side of the high thermal conductivity region. Solder resist or another insulative coating may be applied to a surface of the high thermal conductivity region and surrounding areas of the exterior layer of the PCB core layer. This insulative layer can be effective to electrically isolate the high thermal conductivity region, and circuitry connected thereto, from a heat sink or other conductive structures mounted on or proximate the exterior layer of the PCB core layer.

At 812, an image sensor is mounted to the PCB core layer and over a second side of the high thermal conductivity region. In some cases, the image sensor is mounted by soldering electrical contacts of the image sensor to exposed electrical pads of the PCB core layer. In other cases, the image sensor is glued or soldered to the second side of the high thermal conductivity region. In such cases, electrical connections to the image sensor can be formed via wire bonds to corresponding electrical pads located in the cavity or an exterior layer of the asymmetric PCB.

At 814, a lens and lens support structure are mounted to an exterior PCB layer. The lens and lens support structure are mounted such that the lens is positioned over the cavity in which the image sensor resides. The lens may be mounted using any suitable material, such as an adhesive, gasket material, epoxy, and the like. In some cases, the lens extends through the lens support structure and into the cavity in which the image sensor resides. In such cases, this can be effective to further reduce a height of the ultra-compact image sensor assembly.

The lens support structure may mounted planar to the exterior PCB layer. In other cases, the lens support structure is elevated from the exterior PCB layer to accommodate wire bonds of the image sensor. Alternately or additionally, the lens support structure may include self-locating features that fit into the cavity (e.g., below the exterior layer) to ensure correct placement of the lens support structure, and thus a lens mounted therein.

At 816, the lens is focused and locked in the lens support structure. The lens is focused such that light entering the lens is focused on the image sensor mounted in the cavity. After focusing, the lens can then be locked in the lens support structure to prevent subsequent movement of the lens and/or to prevent the lens from becoming unfocussed.

Aspects of these methods may be implemented in hardware (e.g., fixed logic circuitry), firmware, a System-on-Chip (SoC), software, manual processing, or any combination thereof (e.g., automation equipment). A software implementation represents program code that performs specified tasks when executed by a computer processor, such as software, applications, routines, programs, objects, components, data structures, procedures, modules, functions, and the like. For example, program code executed by a processor may control one or more circuit board, material injection, and/or component placement machines to implement operations of the methods to fabricate an apparatus or assembly described herein. The program code can be stored in one or more computer-readable memory devices, both local and/or remote to a computer processor. The methods may also be practiced in a distributed computing environment by multiple computing devices.

Example Device

Figure 9:
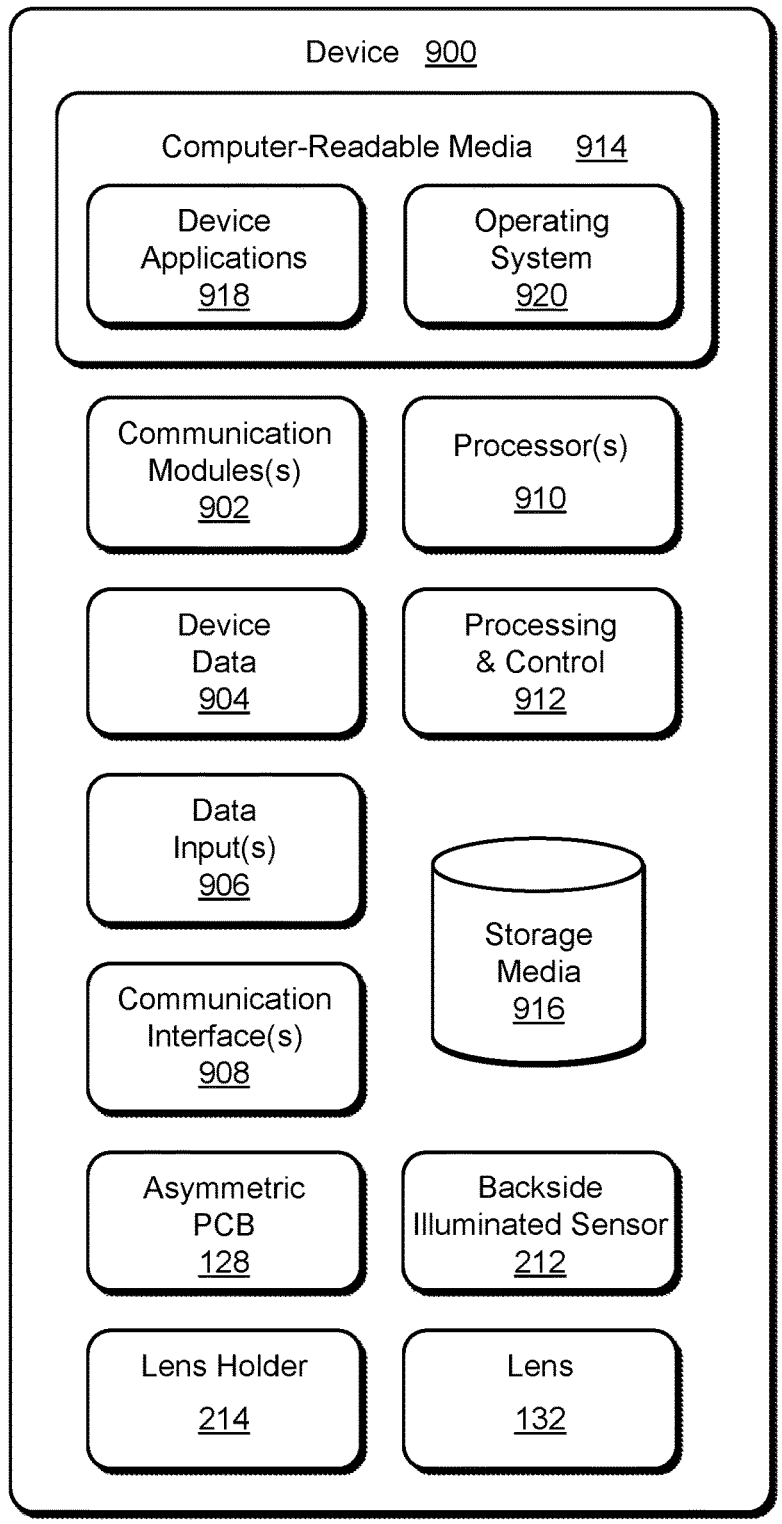
FIG. 9 illustrates an example system in which an ultra-compact image sensor assembly can be implemented.

FIG. 9 illustrates various components of an example device 900 that can be implemented as any type of mobile, electronic, imaging, and/or computing device as described with reference to the previous FIGS. 1-5 to implement an ultra-compact image sensor assembly. In embodiments, the device 900 can be implemented as one or a combination of a wired and/or wireless device, as a form of imaging device, depth sensor, gesture sensor, television client device (e.g., television set-top box, digital video recorder (DVR), etc.), consumer device, computer device, server device, portable computer device, user device, communication device, video processing and/or rendering device, appliance device, gaming device, electronic device, and/or as another type of device. The device 900 may also be associated with a user (e.g., a person) and/or an entity that operates the device such that a device describes logical devices that include users, software, firmware, and/or a combination thereof.

The device 900 includes communication modules 902 that enable wired and/or wireless communication of device data 904 (e.g., received data, data that is being received, data scheduled for broadcast, data packets of the data, etc.). The device data 904 or other device content can include configuration settings of the device, media content stored on the device, and/or information associated with a user of the device. The media content stored on the device 900 may include any type of audio, video, graphical, depth, and/or image data. The device 900 includes one or more data inputs 906 via which any type of data, media content, and/or inputs can be received, such as user-selectable inputs, messages, music, television media content, recorded video content, and any other type of audio, video, and/or image data received from any content and/or data source.

The device 900 also includes communication interfaces 908, which can be implemented as any one or more of a serial and/or parallel interface, a wireless interface, any type of network interface, a modem, and as any other type of communication interface. The communication interfaces 908 provide a connection and/or communication links between the device 900 and a communication network by which other electronic, computing, and communication devices communicate data with the device 900.

The device 900 includes one or more processors 910 (e.g., application processors, microprocessors, microcontrollers, digital-signal processors, and the like), which process various computer-executable instructions to control operations of the device 900. Alternatively or in addition, the device 900 can be implemented with any one or combination of hardware, firmware, or fixed logic circuitry that is implemented in connection with processing and control circuits which are generally identified at 912. Although not shown, the device 900 can include a system bus or data transfer system that couples the various components within the device. A system bus can include any one or combination of different bus structures, such as a memory bus or memory controller, a peripheral bus, a universal serial bus, a processor bus and/or a local bus that utilizes any of a variety of bus architectures.

The device 900 also includes computer-readable storage media 914, such as one or more memory devices that enable persistent and/or non-transitory data storage (i.e., in contrast to mere signal transmission), examples of which include random access memory (RAM), non-volatile memory, read-only memory (ROM), or flash memory. The device 900 can also include a mass storage media device 916, such as a hard disk drive, solid-state drive, a recordable and/or rewriteable compact disc (CD), any type of a digital versatile disc (DVD), and the like.

The computer-readable storage media 914 and/or mass storage media 916 provide data storage mechanisms to store the device data 904, as well as various device applications 918 and any other types of information and/or data related to operational aspects of the device 900. For example, an operating system 920 can be maintained as processor-executable code within the computer-readable storage media 914 and executed by the processors 910. The device applications 918 may include a device manager, such as any form of a control application, software application, signal-processing and control module, code that is native to a particular device, a hardware abstraction layer for a particular device, and so on.

This example device 900 also includes an asymmetric PCB 128 and a backside-illuminated sensor 212 to capture imagery. The asymmetric PCB 128 includes a cavity in which the backside-illuminated sensor 212 can be mounted and electrical pads for the backside-illuminated sensor 212. In some cases, the electrical pads are disposed at the bottom of the cavity and a ball grid array connects electrical contacts of the backside-illuminated sensor 212 to respective ones of the electrical pads. A lens holder 214 of the device 900 is mounted to asymmetric PCB 128 and is configured to support a lens 132, which directs light into the backside-illuminated sensor 212. By mounting the backside-illuminated sensor 212 in the cavity of the asymmetric PCB 128, height and planar dimensions associated with these components are reduced, thereby enabling the device 900 to be implemented with a thinner profile. These components, such as the asymmetric PCB 128, backside-illuminated sensor 212, lens holder 214, and lens 132 may be implemented similar to or differently from the respective components described with reference to FIGS. 1-8.

CONCLUSION AND EXAMPLE IMPLEMENTATIONS

Example implementations described herein include, but are not limited to, one or any combinations of one or more of the following examples:

A printed circuit board assembly comprising: a multilayer printed circuit board (PCB) having an asymmetric core structure; a cavity that extends from an exterior layer of the multilayer PCB to an exposed portion of an interior layer of the multilayer PCB, the interior layer formed on the asymmetric core structure; and an image sensor mounted at least partially in the cavity and having electrical contacts connected to conductive pads embodied on the exposed portion of the interior layer of the multilayer PCB.

A printed circuit board assembly as described above, wherein the exterior layer of the multilayer PCB is a first exterior layer and the printed circuit board assembly further comprises vias that extend from the exposed portion of the interior layer through the asymmetric core structure to a second exterior layer of the multilayer PCB that is opposite the first exterior layer of the multilayer PCB.

A printed circuit board assembly as described above, further comprising a layer of insulative material covering ends of the vias that extend through the asymmetric core structure and a portion of the second exterior layer of the multilayer PCB.

A printed circuit board assembly as described above, further comprising a layer of thermally conductive material between ends of the vias that extend through the asymmetric core structure and a physical housing of the image sensor.

A printed circuit board assembly as described above, further comprising thermally conductive material that occupies the vias that extend through the asymmetric core structure of the multilayer PCB.

A printed circuit board assembly as described above, further comprising a lens support structure that is mounted planer to the exterior layer of the multilayer PCB and a lens mounted in the lens support structure and over the cavity in which the image sensor resides.

A printed circuit board assembly as described above, wherein the lens extends through the lens support structure and into the cavity such that at least a portion of the lens resides below the exterior layer of the multilayer PCB.

A printed circuit board assembly as described above, wherein: a thickness of the multilayer PCB is approximately one-half to one millimeter; a depth of the cavity is approximately 100 to 1000 microns; and a thickness of the core structure is approximately 100 to 500 microns.

A method for manufacturing an image sensor assembly, the method comprising: forming a printed circuit board (PCB) core layer on which electrical contacts are embodied; forming multiple PCB layers that include a through-layer hole; laminating the multiple PCB layers that include the through-layer hole to one side of the PCB core layer to form a multilayer PCB having an asymmetric core structure; and mounting an image sensor in a cavity formed by respective through-layer holes of the multiple PCB layers and to the PCB core layer by soldering electrical contacts of the image sensor to the electrical contacts of PCB core layer.

A method as described above, further comprising drilling vias from a first side of the PCB core layer on which the electrical contacts are embodied to a second side of the PCB core layer that is opposite the first side.

A method as described above, further comprising filling the vias that extend from the first side of the PCB core layer to the second side of the PCB core layer with thermally conductive material.

A method as described above, further comprising applying a layer of insulative material to ends of the vias that are exposed proximate the second side of the PCB core layer.

A method as described above, further comprising applying a thermally conductive material between a physical housing of the image sensor and ends of the vias proximate the first side of the PCB core layer.

A method as described above, further comprising: mounting a lens support structure to an exterior layer of the multilayer PCB formed by one of the multiple PCB layers, the lens support structure being mounted planar to the exterior layer of the multilayer PCB; and mounting a lens in the lens support structure and over the cavity in which the image sensor resides, the lens extending through the lens support structure and into the cavity such that a portion of the lens resides below the exterior layer of the multilayer PCB.

A method as described above, further comprising: focusing the lens such that light received by the lens is focused on the image sensor mounted in the cavity; and locking, once focused, the lens in the lens support structure effective to prevent the lens from becoming unfocused.

An apparatus comprising: a multilayer printed circuit board (PCB) comprising an asymmetric stack-up that includes a core layer having a first side forming a first exterior layer of the multilayer PCB and a second side to which other layers of the multilayer PCB are laminated to form the multilayer PCB, one of the other layers forming a second exterior surface of the multilayer PCB that is opposite the first exterior layer; a cavity extending from the second exterior layer of the multilayer to the second side of the core layer on which electrical contacts are embodied; a thermally conductive structure aligned with the cavity that extends from the first side of the core layer to the second side of the core layer; and an image sensor mounted at least partially in the cavity, having electrical contacts connected to the electrical contacts of the core layer, and having a physical housing that is thermally coupled to the thermally conductive structure.

An apparatus as described above, wherein the core layer comprises a layer of fiberglass having a thickness of approximately 100 microns to 400 microns and the other layer comprise fiber pre-impregnation layers having respective thicknesses of less than 150 microns.

An apparatus as described above, further comprising: a layer of insulative material over a portion of the thermally conductive structure that is substantially coplanar with the first side of the core layer and first exterior layer of the multilayer PCB; a lens support structure mounted to the second exterior layer of the multilayer PCB; and a lens mounted in the lens support structure that extends through the lens support structure and into the cavity such that a light transmitting surface of the lens resides below the second exterior layer of the multilayer PCB and above a light receiving surface of the image sensor.

An apparatus as described above, wherein the thermally conductive structure comprises thermal vias or a high thermal conductivity region that extends through the core layer of the multilayer PCB.

An apparatus as described above, wherein the thermal vias are filled with or the high thermal conductivity region comprises copper, copper alloy, metal particle filled resin, metal particle filled epoxy, carbon foam, or a nanotube composite.

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A printed circuit board assembly comprising:
    a multilayer printed circuit board (PCB) having an asymmetric core structure;
    a cavity that extends from a first exterior layer of the multilayer PCB to an exposed portion of an interior layer of the multilayer PCB, the interior layer formed on the asymmetric core structure;
    an image sensor mounted at least partially in the cavity and having electrical contacts connected to conductive pads embodied on the exposed portion of the interior layer of the multilayer PCB;
    vias that extend from the exposed portion of the interior layer through the asymmetric core structure to a second exterior layer of the multilayer PCB that is opposite the first exterior layer of the multilayer PCB; and
    a layer of insulative material positioned covering ends of the vias and a portion of the second exterior layer of the multilayer PCB.

2. The printed circuit board assembly of claim 1, wherein the image sensor occupies less than half a depth of the cavity.

3. The printed circuit board assembly of claim 1, further comprising solder balls that connect the electrical contacts of the image sensor to the conductive pads embodied on the exposed portion of the interior layer of the multilayer PCB.

4. The printed circuit board assembly of claim 1, further comprising a layer of thermally conductive material between ends of the vias that extend through the asymmetric core structure and a physical housing of the image sensor.

5. The printed circuit board assembly of claim 1, further comprising thermally conductive material that occupies the vias that extend through the asymmetric core structure of the multilayer PCB.

6. The printed circuit board assembly of claim 1, further comprising a lens support structure that is mounted planer to the first exterior layer of the multilayer PCB and a lens mounted in the lens support structure and over the cavity in which the image sensor resides.

7. The printed circuit board assembly of claim 6, wherein the lens extends through the lens support structure and into the cavity such that at least a portion of the lens resides below the first exterior layer of the multilayer PCB.

8. The printed circuit board assembly of claim 1, wherein:
a thickness of the multilayer PCB is approximately one-half to one millimeter;
a depth of the cavity is approximately 100 to 1000 microns; and
a thickness of the asymmetric core structure is approximately 100 to 500 microns.

9. An apparatus comprising:
a multilayer printed circuit board (PCB) comprising an asymmetric stack-up that includes a core layer having a first side forming a first exterior layer of the multilayer PCB and a second side to which other layers of the multilayer PCB are laminated to form the multilayer PCB, one of the other layers forming a second exterior layer of the multilayer PCB that is opposite the first exterior layer;
a cavity extending from the second exterior layer of the multilayer PCB to the second side of the core layer on which electrical contacts are embodied;
a thermally conductive structure aligned with the cavity that extends from the first side of the core layer to the second side of the core layer; and
an image sensor mounted at least partially in the cavity, having electrical contacts connected to the electrical contacts of the core layer, and having a physical housing that is thermally coupled to the thermally conductive structure.

10. The apparatus of claim 9, wherein the core layer comprises a layer of fiberglass having a thickness of approximately 100 microns to 400 microns and the other layers comprise fiber pre-impregnation layers having respective thicknesses of less than 150 microns.

11. The apparatus of claim 9, further comprising:
a layer of insulative material over a portion of the thermally conductive structure that is substantially coplanar with the first side of the core layer and first exterior layer of the multilayer PCB;
a lens support structure mounted to the second exterior layer of the multilayer PCB; and
a lens mounted in the lens support structure that extends through the lens support structure and into the cavity such that a light transmitting surface of the lens resides below the second exterior layer of the multilayer PCB and above a light receiving surface of the image sensor.

12. The apparatus of claim 9, wherein the thermally conductive structure comprises thermal vias or a high thermal conductivity region that extends through the core layer of the multilayer PCB.

13. The apparatus of claim 12, wherein the thermal vias are filled with or the high thermal conductivity region comprises copper, copper alloy, metal particle filled resin, metal particle filled epoxy, carbon foam, or a nanotube composite.

14. An apparatus comprising:
a multilayer printed circuit board (PCB) comprising a stack-up that includes a core layer having a first side forming a first exterior layer of the multilayer PCB and a second side to which other layers of the multilayer PCB are laminated to form the multilayer PCB, one of the other layers forming a second exterior layer of the multilayer PCB that is opposite the first exterior layer;
a cavity extending from the second exterior layer of the multilayer PCB to the second side of the core layer;
electrical contacts disposed within the cavity; and
a backside-illuminated image sensor mounted at least partially in the cavity, positioned vertically above the electrical contacts disposed within the cavity, and electrically connected to the electrical contacts disposed within the cavity.

15. The apparatus of claim 14, further comprising a thermally conductive structure aligned with the cavity that extends from the first side of the core layer to the second side of the core layer.

16. The apparatus of claim 15, wherein the thermally conductive structure comprises thermal vias.

17. The apparatus of claim 15, wherein the thermally conductive structure comprises a high thermal conductivity region that extends through the core layer of the multilayer PCB.

18. The apparatus of claim 14, wherein the backside-illuminated image sensor occupies less than half a depth of the cavity.

19. The apparatus of claim 14, wherein the apparatus comprises smart glasses, a smart-phone, a tablet computer, a laptop computer, a digital camera, a range finder, an optical scanner, a web cam, or a television.

20. A wearable device comprising:
a processor;
a computer-readable storage medium storing instructions for execution by the processor;
a display;
an input mechanism; and
a multilayer printed circuit board (PCB) comprising:
a stack-up that includes a core layer having a first side forming a first exterior layer of the multilayer PCB and a second side to which other layers of the multilayer PCB are laminated to form the multilayer PCB, one of the other layers forming a second exterior layer of the multilayer PCB that is opposite the first exterior layer;
a cavity extending from the second exterior layer of the multilayer PCB to the second side of the core layer;
electrical contacts disposed within the cavity; and
a backside-illuminated image sensor mounted at least partially in the cavity, positioned vertically above the electrical contacts disposed within the cavity, and electrically connected to the electrical contacts disposed within the cavity,
wherein the backside-illuminated image sensor is configured to capture at least one of ambient light levels, imagery, or color information in a vicinity of the wearable device.

21. The wearable device of claim 20, embodied as smart glasses.

22. The wearable device of claim 20, wherein the instructions provide an operating system configured to manage the display, the input mechanism, and the backside-illuminated image sensor.

23. The wearable device of claim 20, wherein the input mechanism comprises a movement-tracking sensor or accelerometer, and the instructions are configured to recognize gestures based at least on the movement-tracking sensor or accelerometer.

* * * * *